United States Patent
Kojima (10) Patent No.: US 10,181,452 B2
(45) Date of Patent: Jan. 15, 2019

(54) METHOD FOR MANUFACTURING LIGHT-EMITTING DEVICE

(71) Applicant: NICHIA CORPORATION, Anan-shi, Tokushima (JP)

(72) Inventor: Yuji Kojima, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/877,846

(22) Filed: Jan. 23, 2018

(65) Prior Publication Data
US 2018/0218995 A1 Aug. 2, 2018

(30) Foreign Application Priority Data

Jan. 27, 2017 (JP) .................. 2017-012620

(51) Int. Cl.
*H01L 23/00* (2006.01)
*H01L 33/62* (2010.01)
*H01L 33/52* (2010.01)

(52) U.S. Cl.
CPC .............. *H01L 24/78* (2013.01); *H01L 24/48* (2013.01); *H01L 33/52* (2013.01); *H01L 33/62* (2013.01); *H01L 2224/48091* (2013.01); *H01L 2224/48247* (2013.01); *H01L 2224/48465* (2013.01); *H01L 2224/78824* (2013.01); *H01L 2924/3512* (2013.01); *H01L 2933/005* (2013.01)

(58) Field of Classification Search
CPC combination set(s) only.
See application file for complete search history.

(56) References Cited

U.S. PATENT DOCUMENTS

| 6,036,080 | A | 3/2000 | Takahashi et al. |
| 2004/0262369 | A1 | 12/2004 | Mii et al. |
| 2006/0213956 | A1* | 9/2006 | Yu .................... B23K 20/007 228/180.5 |
| 2007/0034674 | A1* | 2/2007 | Mii .................... B23K 20/002 228/101 |

(Continued)

FOREIGN PATENT DOCUMENTS

| JP | 54-058352 A | 5/1979 |
| JP | S55-008085 A | 1/1980 |

(Continued)

*Primary Examiner* — Ratisha Mehta
(74) *Attorney, Agent, or Firm* — Global IP Counselors, LLP (57) ABSTRACT

A method for manufacturing a light-emitting device includes: a first connecting step of forming a ball portion of the wire joined to a first connecting point on a light emitting element; a first transferring step of transferring the capillary to a first point located in a +Z direction above the first connecting point; a second transferring step of transferring the capillary from the first point to a second point located in a −X direction opposite from a second connecting point on the substrate; a third transferring step of transferring the capillary from the second point to a third point located in a +X direction beyond the second connecting point and in the +Z direction above the second connecting point; a second connecting step of transferring the capillary and joining the wire to the second connecting point; and forming an encapsulating member to encapsulate the wire.

3 Claims, 8 Drawing Sheets

(56) References Cited

U.S. PATENT DOCUMENTS

2009/0308914 A1 12/2009 Mii et al.
2016/0300989 A1 10/2016 Kawano et al.

FOREIGN PATENT DOCUMENTS

| JP | S62-108533 A | 5/1987 |
| JP | H04-155843 A | 5/1992 |
| JP | 05-226428 A | 9/1993 |
| JP | 09-082738 A | 3/1997 |
| JP | H10-256297 A | 9/1998 |
| JP | 2003-273150 A | 9/2003 |
| JP | 2005-142314 A | 6/2005 |
| JP | 2008-160149 A | 7/2008 |
| JP | 2009-503822 A | 1/2009 |
| JP | 2016-201456 A | 12/2016 |
| WO | 2007012187 A1 | 2/2007 |

* cited by examiner

METHOD FOR MANUFACTURING LIGHT-EMITTING DEVICE

CROSS-REFERENCE TO RELATED APPLICATION

This application claims priority to Japanese Patent Application No. 2017-12620, filed on Jan. 27, 2017, the disclosure of which is hereby incorporated by reference in its entirety.

BACKGROUND OF THE INVENTION

1. Field of the Invention

The present invention relates to a method for manufacturing a light-emitting device.

2. Description of Related Art

Light-emitting devices, such as light-emitting diodes (LEDs), including semiconductor elements such as light-emitting elements and protective elements mounted on substrates are known. The semiconductor elements are electrically joined to electrically-conductive members on the substrates by, for example, wires. In addition, for the purpose of, for example, protection against external environments, the semiconductor elements and the wires are encapsulated with encapsulating members containing resin materials.

Various shapes are known as the wire loop shapes that vary depending on the purpose and the intended use. For example, loop shapes that include flexures are known. For example, a loop shape that includes a circular arc portion, a horizontal portion, and an inclined portion between a first bond point and a second bond point is known (for example, Japanese Unexamined Patent Application Publication No. 2008-160149). Such a loop shape is formed by a reverse operation of a capillary performed above a press-bonded ball.

Also, a method for forming a wire into a runway-like loop shape at a second bonding point is known (for example, Japanese Unexamined Patent Application Publication No. 2005-142314). Such a loop shape is formed by connecting the wire to the second bonding point through squashing and then squashing again part of the wire near the second bonding point with a capillary.

Provided is a method for easily forming a light-emitting device including a wire that has a loop shape including a flexure.

SUMMARY

An embodiment of the present invention includes the following constitution.

A method for manufacturing a light-emitting device according to one embodiment includes: providing a substrate on which a light-emitting element is mounted; a first connecting step of forming an initial ball on a wire inserted into a capillary, bringing the initial ball into contact with a first connecting point on the light-emitting element to form a ball portion of the wire joined to the first connecting point; a first transferring step of transferring the capillary to a first point located in a +Z direction above the first connecting point; a second transferring step of transferring the capillary from the first point to a second point located in a −X direction from the first point, the −X direction being opposite from a second connecting point on the substrate; a third transferring step of transferring the capillary from the second point to a third point located in a +X direction beyond the second connecting point on the substrate and located in the +Z direction above the second connecting point; a second connecting step of transferring the capillary to the second connecting point located in the −X direction from the third point and joining the wire to the second connecting point so that the first connecting point on the light emitting element and the second connecting point on the substrate are connected via the wire with the second connecting point being located in the +X direction from the first connecting point; and forming an encapsulating member to encapsulate the wire.

By the above-mentioned method, a light-emitting device including a wire that has a loop shape including a flexure is easily formed.

DETAILED DESCRIPTION OF EMBODIMENTS

The following describes an embodiment of the present invention with reference to the drawings. The embodiment below exemplifies a method for manufacturing a light-emitting device embodying the technical concept of the present invention and is not intended to limit the method for manufacturing a light-emitting device of the present invention.

Also, in the present specification, members disclosed in Claims are never limited to the members in the embodiment. In particular, unless specifically stated otherwise, the sizes, materials, shapes, and relative positions of constituent components described in the embodiment do not limit the scope of the present disclosure to the aforementioned descriptions only but merely provide examples for illustration. It is noted that there is a case where magnitudes or positional relations of members illustrated in each drawing are exaggerated in order to clarify the descriptions. Furthermore, in the descriptions below, the same name or reference numeral represents the same member or a member made of the same material, and its detailed description will be omitted as appropriate.

Figure 1A:
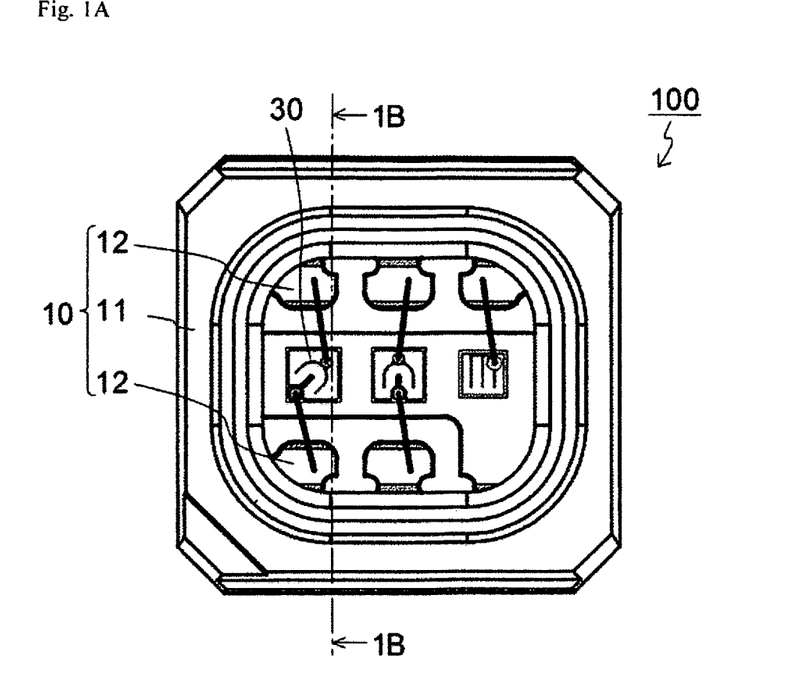
FIG. 1A is a schematic top view of an illustrative light-emitting device obtained by a method for manufacturing a light-emitting device according to an embodiment.
Figure 1B:
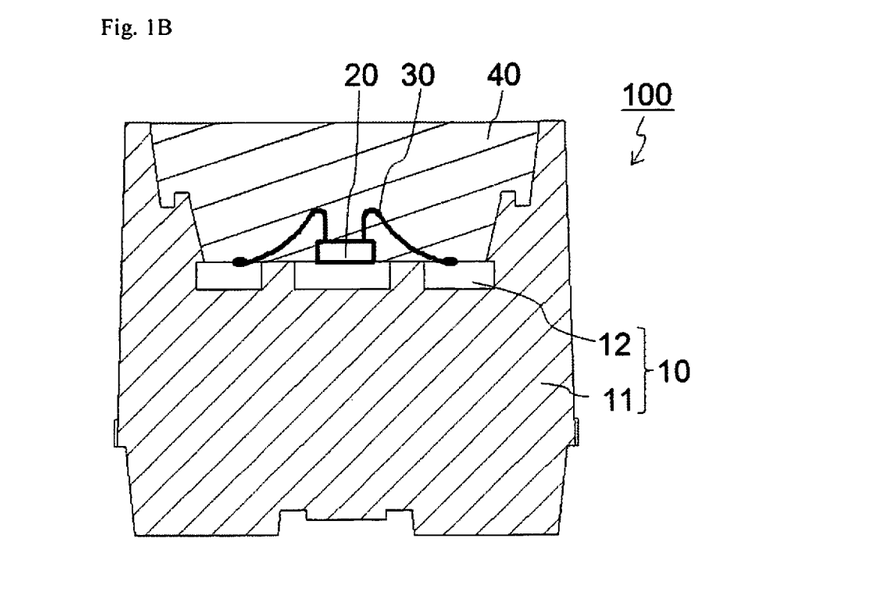
FIG. 1B is a schematic cross-sectional view taken along the line 1B-1B in FIG. 1A.
Figure 1C:
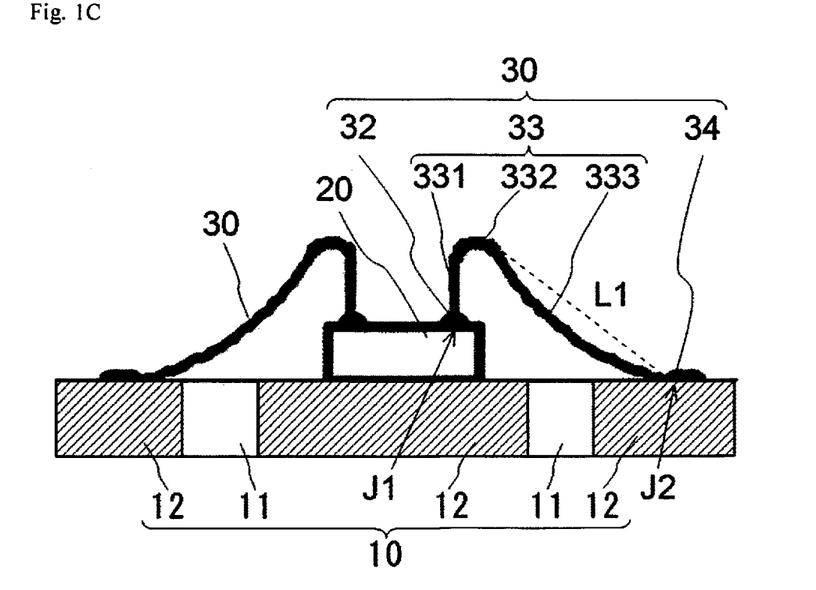
FIG. 1C is a schematic partial enlarged view of FIG. 1B.

FIG. 1A is a schematic top view of a light-emitting device 100 obtained by a method for manufacturing a light-emitting device according to an embodiment. FIG. 1B is a schematic cross-sectional view taken along the line 1B-1B in FIG. 1A. FIG. 1C is a schematic partial enlarged view of part of FIG. 1B including wires 30. The light-emitting device 100 includes light-emitting elements 20, a substrate 10, and the wires 30. In addition, the light-emitting device 100 includes an encapsulating member 40 that encapsulates the light-emitting elements 20 and the wires.

The light-emitting elements 20 each include a layered structure, which includes semiconductor layers, and electrodes on the upper surface of the layered structure. The upper surfaces of the electrodes have first connecting points J1 to which the wires 30 are connected.

The substrate 10 includes an insulating base material 11 and electrically-conductive members 12 that function as electrodes to supply electricity to the light-emitting elements 20. The electrically-conductive members 12 have second connecting points J2 to which the wires 30 are connected.

The wires 30 connect the first connecting points J1 with the second connecting points J2. Each of the wires 30 includes a ball portion 32 and a connecting portion 34 respectively connected to the first connecting point J1 and the second connecting point J2. A loop portion 33 between the ball portion 32 and the connecting portion 34 includes a neck portion 331 above the ball portion 32, and a bent portion 332 that is located at the highest position in the loop portion 33. The loop portion 33 further includes a flexure portion 333 between the bent portion 332 and the connecting portion 34. The flexure portion 333 has a length longer than that of a shortest imaginary line L1 that is a straight line connecting the bent portion 332 and the connecting portion 34. Also, the flexure portion 333 has a shape including a flexure such that the flexure portion 333 is located below the shortest imaginary line L1.

Since the wire 30 has such a loop shape including the flexure portion 333, breaking of the wire 30 due to expansion and contraction of the encapsulating member 40 is prevented.

The above-mentioned light-emitting device 100 can be obtained by the following manufacturing method. FIG. 2 to FIG. 7 are diagrams schematically illustrating the manufacturing method according to the embodiment.

The method for manufacturing a light-emitting device according to the embodiment includes the following steps as main steps. That is, the method includes providing a substrate that has a light-emitting element mounted thereon, connecting a wire, and forming an encapsulating member as main steps. Furthermore, the connecting of a wire includes a first connecting step, a first transferring step, a second transferring step, a third transferring step, and a second connecting step. The following describes each step in detail.

Providing Substrate That Has Light-Emitting Element Mounted Thereon

Figure 2:
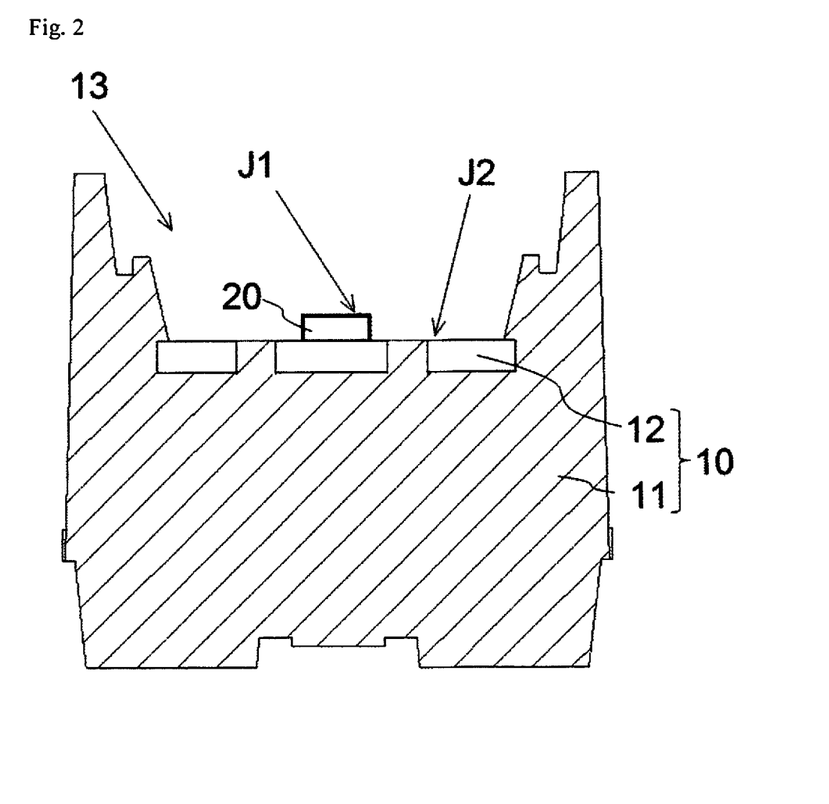
FIG. 2 is a schematic cross-sectional view for illustrating the method for manufacturing a light-emitting device according to the embodiment.

The substrate 10 that has the light-emitting elements 20 mounted thereon is provided, as shown in FIG. 2. FIG. 2 illustrates the substrate 10 that constitutes one light-emitting device, but a collective substrate including a plurality of portions that respectively constitute a plurality of light-emitting devices is used as the substrate 10 in the steps.

The light-emitting elements 20 each include the layered structure, which includes the semiconductor layers including a light-emitting layer, and electrodes that supply a current to the layered structure. The electrodes have the first connecting points J1 to which the wires described later are connected.

In the layered structure, for example, a nitride compound semiconductor, such as $In_XAl_YGa_{1-X-Y}N$ ($0 \leq X$, $0 \leq Y$, $X+Y \leq 1$), is suitably used for the semiconductor layers. Examples of the element substrate include sapphire and GaN.

The electrode pair of the light-emitting element is disposed on the upper surface of the layered structure. Each electrode of the electrode pair has the first connecting point J1. In the case where the electrode pair is disposed with each electrode on two opposite surfaces of the layered structure, only one first connecting point J1 exists. For example, Au, Pt, Pd, Rh, Ni, W, Mo, Cr, Ti, or the like can be used for the electrodes. The thickness of the electrodes is, for example, preferably about some micrometers.

One or more light-emitting elements can be disposed. The example shown in FIG. 1A can include, for example, three light-emitting elements (a blue light-emitting element, a green light-emitting element, and a red light-emitting element) that have different emission wavelengths. This structure is not limiting, and a plurality of light-emitting elements that have the same emission wavelength can be included. Alternatively, light-emitting elements that emit ultraviolet light can be used. Further, the light-emitting device 100 may include a protective element, such as a Zener diode and a bridge diode, in addition to the light-emitting elements.

The light-emitting elements are fixed on the substrate 10 with electrically-conductive or insulating bonding members. One light-emitting device can include one or more light-emitting elements.

The substrate 10 includes the electrically-conductive members 12 that function as electrodes and the base material 11 that holds the electrically-conductive members 12. The substrate 10 can have a depressed portion 13 as shown in FIG. 2. Alternatively, the substrate 10 may be a flat plate.

The electrically-conductive members 12 of the substrate 10 have second connecting points J2 to which the wires described later are connected.

A substrate used in the field of the invention can be used as the substrate 10. For example, a resin package that includes a resin molding as the base material 11 and leads as the electrically-conductive members 12 can be used. Alternatively, a ceramic package that includes a ceramic as the base material 11 and wiring as the electrically-conductive members 12 can be used.

The substrate 10 provided is secured at a predetermined position on a wire bonder.

Connecting Wire

Figure 3A:
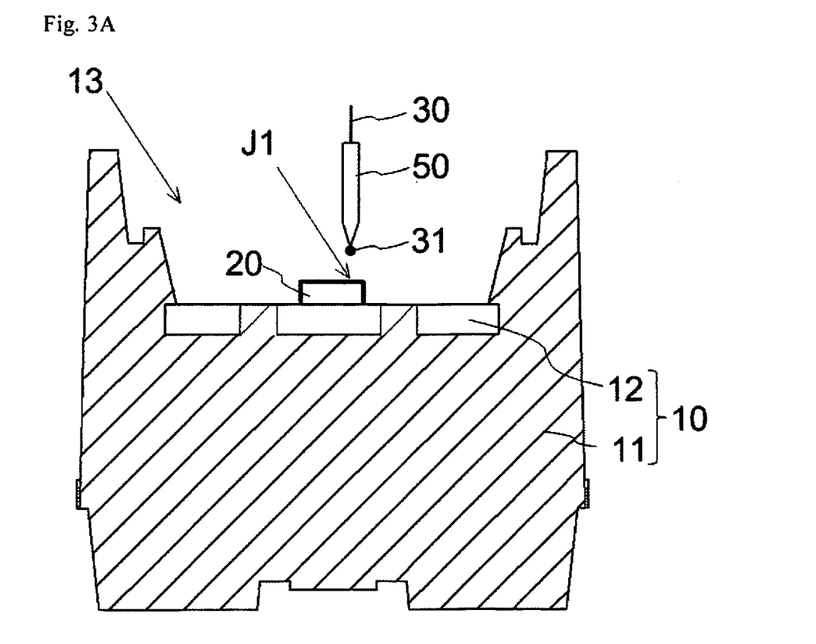
FIG. 3A is a schematic cross-sectional view for illustrating the method for manufacturing a light-emitting device according to the embodiment.
Figure 3B:
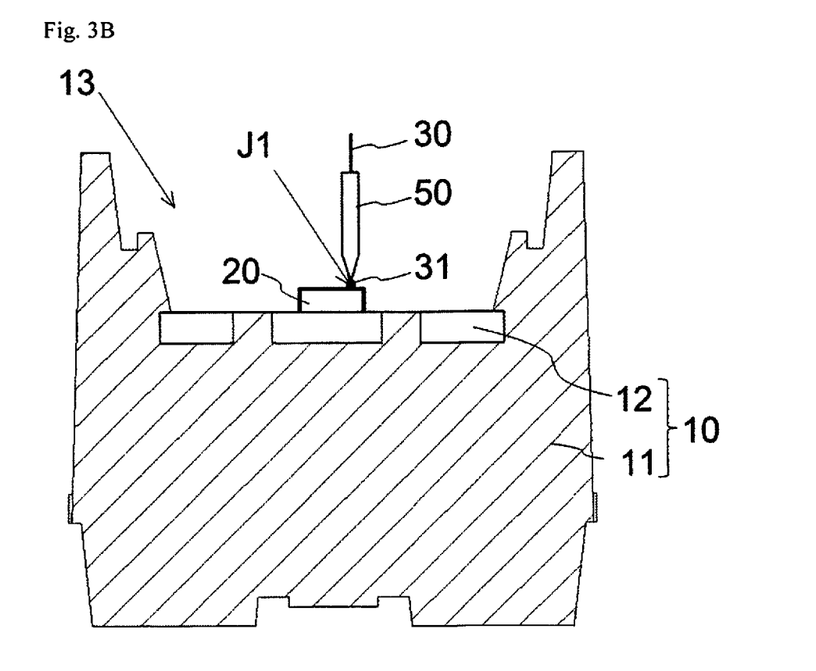
FIG. 3B is a schematic cross-sectional view for illustrating the method for manufacturing a light-emitting device according to the embodiment.
Figure 4A:
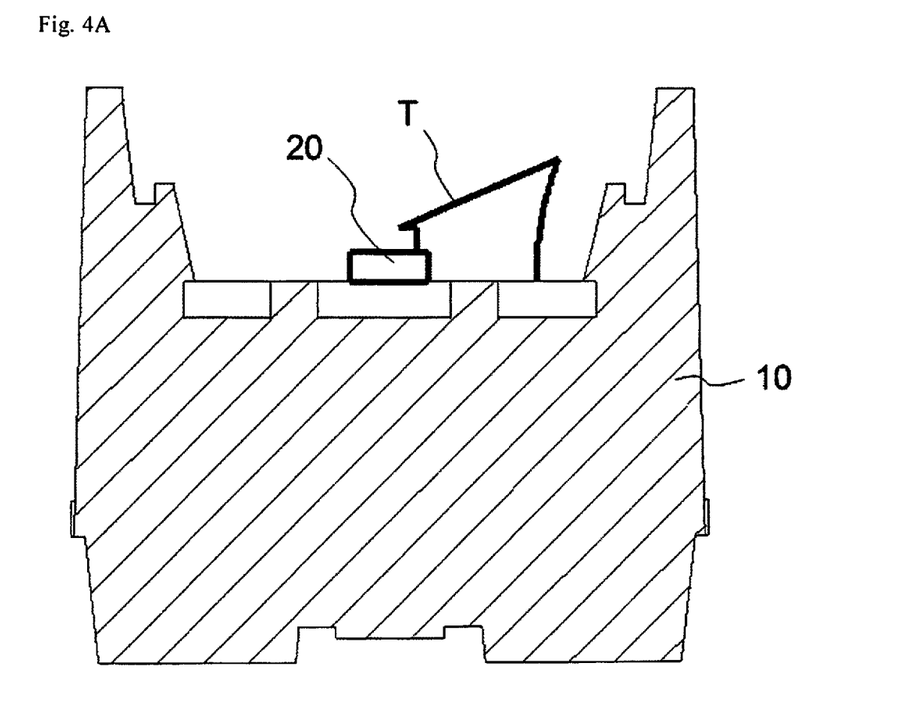
FIG. 4A is a schematic cross-sectional view showing a movement track of a capillary in the method for manufacturing a light-emitting device according to the embodiment.
Figure 4B:
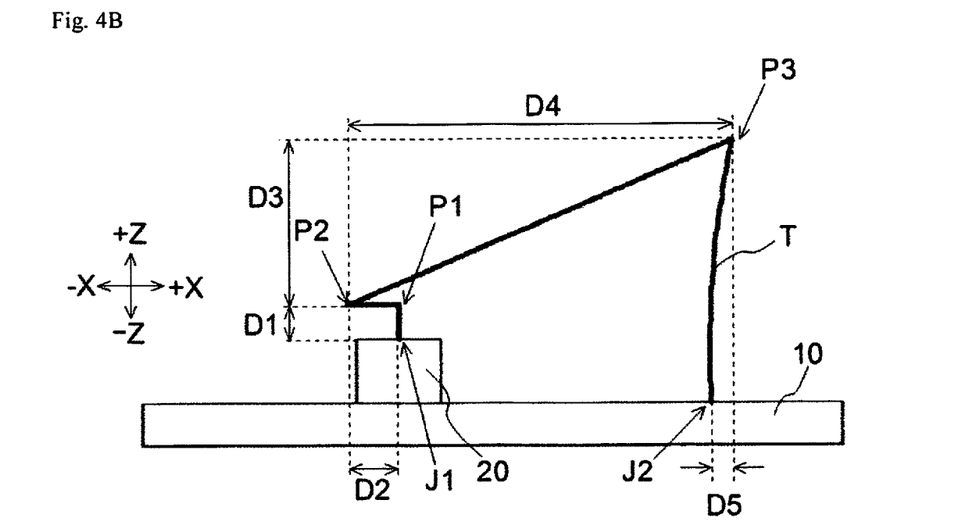
FIG. 4B is a schematic partial enlarged view of FIG. 4A.
Figure 5:
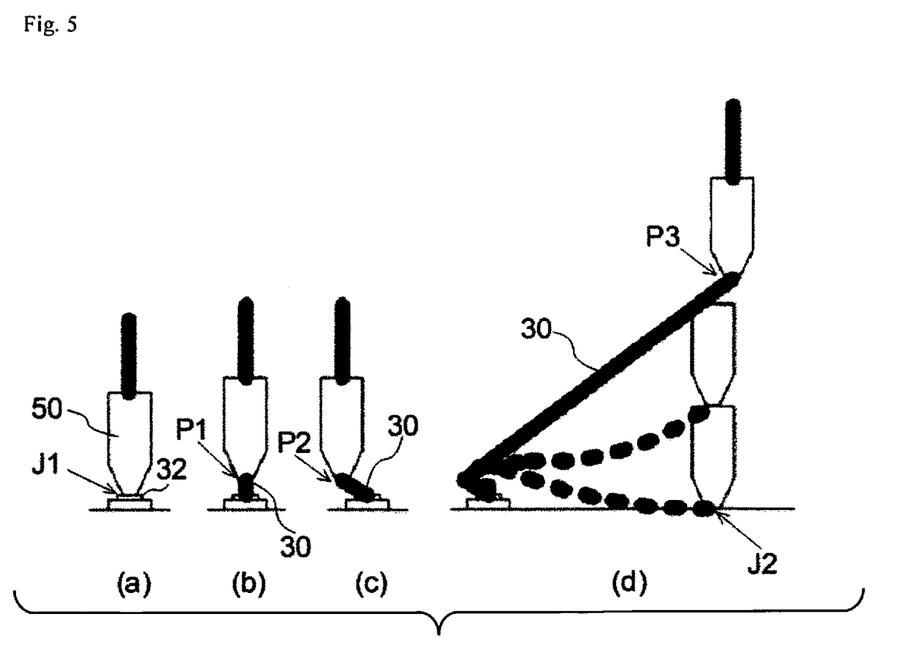
FIG. 5 includes diagrams (a) to (d) schematically showing wire shapes at respective points along the movement track shown in FIG. 4B.

FIG. 3A to FIG. 5 are diagrams schematically illustrating the connecting of a wire. FIG. 4A and FIG. 4B are diagrams schematically showing a movement track T of a capillary. FIG. 4B is a schematic partial enlarged view of FIG. 4A. FIG. 5 includes diagrams (a) to (d) schematically showing shapes of the wire 30 at respective points along the movement track T shown in FIG. 4B.

As shown in FIG. 4B, the rightward direction is the +X direction, and the opposite leftward direction is the −X direction in the descriptions below. Also, the descriptions will be made on the assumption that the second connecting point J2 is located in the +X direction from the first connecting point J1. The positional relation between the first connecting point and the second connecting point defines the orientation of the X direction. Hence, in the case where the second connecting point is located on the left hand of the first connecting point in a drawing, the direction in which the second connecting point is located is the +X direction.

The +X and −X directions indicate not only the horizontal directions. The +X and −X directions include directions inclined at about 30° upward or downward from the horizontal directions.

The connecting of a wire includes the first connecting step, the first transferring step, the second transferring step, the third transferring step, and the second connecting step. These steps describe connecting of one wire. In the case where a plurality of wires are joined, the following steps are performed for each wire. In the case where a plurality of wires are connected, the following steps may be applied to all the wires or to only part of the wires.

(First Connecting Step)

In the first connecting step, the wire 30 is connected to the first connecting point J1. The ball portion 32 of the wire 30 is formed in the first connecting step. In the first connecting step, an initial ball 31 is first formed on the wire 30 inserted into a capillary 50, as shown in FIG. 3A. Specifically, the initial ball 31 is formed by melting the tip of the wire 30 using electric discharge or the like. Conditions of electric discharge or the like can be appropriately selected depending on the composition and diameter of the wire 30, the intended size of the initial ball 31, and the like.

Subsequently, the initial ball 31 is brought into contact with and press-bonded to the first connecting point J1 on the light-emitting element 20, as shown in FIG. 3B and FIG. 5(a). The first connecting point J1 is located on the electrode on the upper surface of the light-emitting element 20, and the initial ball 31 is press-bonded to the electrode. The initial ball 31 thus becomes the ball portion 32.

(First Transferring Step)

In the first transferring step, the capillary 50 is transferred upward. The neck portion 331 of the wire 30 is formed in the first transferring step. In the first transferring step, specifically, the capillary 50 is transferred to a first point P1 located in the +Z direction above the first connecting point J1, as shown in FIG. 4B and FIG. 5(b). During the first transferring step, the wire 30 that extends from the ball portion 32 is inserted into a through-hole of the capillary 50 and is not fixed. Hence, the wire 30 is paid out from the tip of the capillary 50 along with the transfer of the capillary 50 in the first transferring step. The capillary 50 is transferred while paying out the wire 30 from its tip also in the second transferring step and the third transferring step described later.

The first point P1 is a position that defines the length of the neck portion 331 in the loop shape of the wire 30. In other words, the position of the first point P1 determines the length of the neck portion 331. The first point P1 is preferably located directly above the first connecting portion J1, that is, directly above the ball portion 32, more preferably directly above the center of the ball portion 32.

A distance D1 between the first connecting point J1 and the first point P1, that is, the distance D1 in the first transferring step, can be freely set, but 80 μm or more is preferable.

(Second Transferring Step)

In the second transferring step, the capillary 50 is transferred from the first point P1 to a second point P2. The bent portion 332 of the wire 30 is formed in the second transferring step. The second point P2 is located in the −X direction when viewed from the first point P1, as shown in FIG. 4B. The operation of the capillary in the second transferring step is what is called a reverse operation. When the capillary 50 is transferred to the second point P2 in the second transferring step, the wire 30 is pulled in a slant direction from the ball portion 32, as shown in FIG. 5(c).

The second point P2 is a position that defines the bent portion 332 in the loop shape of the wire 30. The position of the second point P2 determines the shape of the bent portion 332.

A distance D2 between the first point P1 and the second point P2, that is, the distance D2 in the second transferring step, can be freely set, but 100 μm or less is preferable.

(Third Transferring Step)

In the third transferring step, the capillary 50 is transferred from the second point P2 to a third point P3. The flexure portion 333 of the wire 30 is formed in the third transferring step. The third point P3 is located in the +X direction when viewed from the second point P2, as shown in FIG. 4. Also, the third point P3 is located beyond in the +X direction and above the second connecting point J2 on the substrate 10. Specifically, the third point P3 is located at a distance D5 away from the second connecting point J2 in the +X direction. In other words, the third point P3 is farther than the second connecting point J2.

The third point P3 is a position that defines the length of the flexure portion 333 in the loop shape of the wire 30. The position of the third point P3 determines the length of the flexure portion 333.

The third point P3 is located at a distance D3 away from the second point P2 in the +Z direction and a distance D4 (distance in a top view) away from the second point P2 in the +X direction. In other words, the third point P3 is located obliquely above the second point P2. In the third transferring step, the wire 30 is pulled obliquely upward as shown in FIG. 5(d).

The distance D3 is preferably equal to or shorter than the distance D4. The ratio of the distance D3 to the distance D4 is, for example, preferably about D3:D4=1:1 to 1:5.

The distance D5 between the second connecting point J2 and the third point P3 in a top view is, for example, preferably about 30 to 150 μm.

(Second Connecting Step)

In the second connecting step, the wire 30 is connected to the second connecting point J2. The connecting portion 34 of the wire 30 is formed in the second connecting step. The second connecting point J2 is located on the electrically-conductive member 12 on the substrate 10, and the electrically-conductive member 12 is connected to the wire 30. The second connecting point J2 is located at the distance D5 away from the third point P3 in the −X direction, as shown in FIG. 4.

Since the second connecting point J2 is located in the −X direction from the third point P3, the portion of the wire 30 paid out from the capillary 50 in the third transferring step has a length longer than a shortest distance between the third point P3 and the second connecting point J2. Accordingly, the wire 30 has a flexure between the third point P3 and the second connecting point J2 as shown in FIG. 5(d). In other words, since the capillary 50 is transferred to the third point P3 located farther than the second connecting point J2, the wire 30 paid out from the capillary 50 is long. The flexure portion 333 is thus formed.

The wire 30 that has the shape of a loop 33 including the flexure portion 333 as shown in FIG. 1C is formed through the above-mentioned steps.

The above-mentioned connecting of a wire is performed for each wire. An example is described, in which two electrodes serving as p- and n-electrodes are disposed on the upper surface of the light-emitting element 20 and each of the electrodes has the first connecting point as shown in FIG. 1A.

Figure 6:
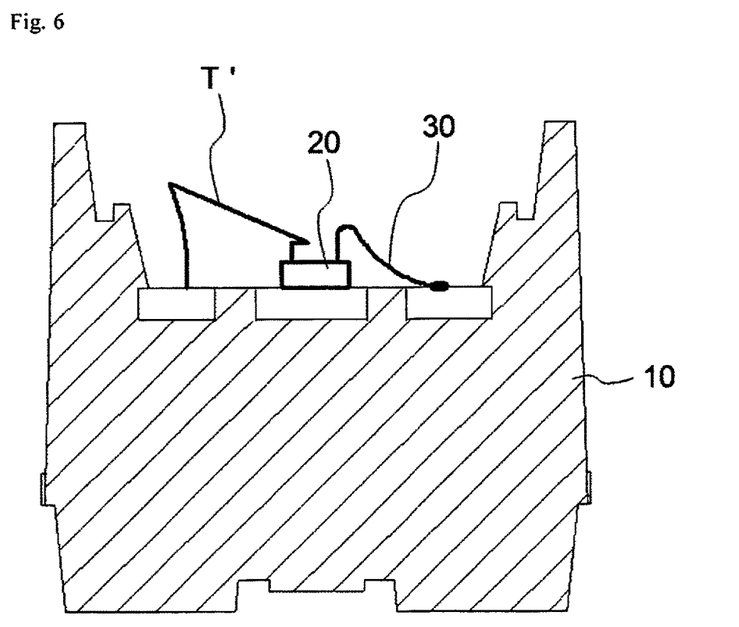
FIG. 6 is a schematic cross-sectional view showing a movement track of the capillary in the method for manufacturing a light-emitting device according to the embodiment.

First, the capillary is transferred along the movement track T as shown in FIG. 4A to connect a wire. Subsequently, the capillary is transferred along a movement track T' as shown in FIG. 6 to connect a second wire. The movement track T' to connect the second wire is a horizontally flipped movement track of the movement track T for the first wire. Through this procedure, a plurality of wires each of which includes the flexure portion are connected.

The loop shape described above is a substantially triangular loop including one bent portion. Such a triangular loop improves thermal-shock properties.

The loop shape may be other shapes than the above-mentioned triangular loop shape. As a modification, the following describes a wire that has a trapezoidal loop shape. The modification also has a flexure portion that produces the same effects as in the case of the above-mentioned triangular loop.

Figure 8A:
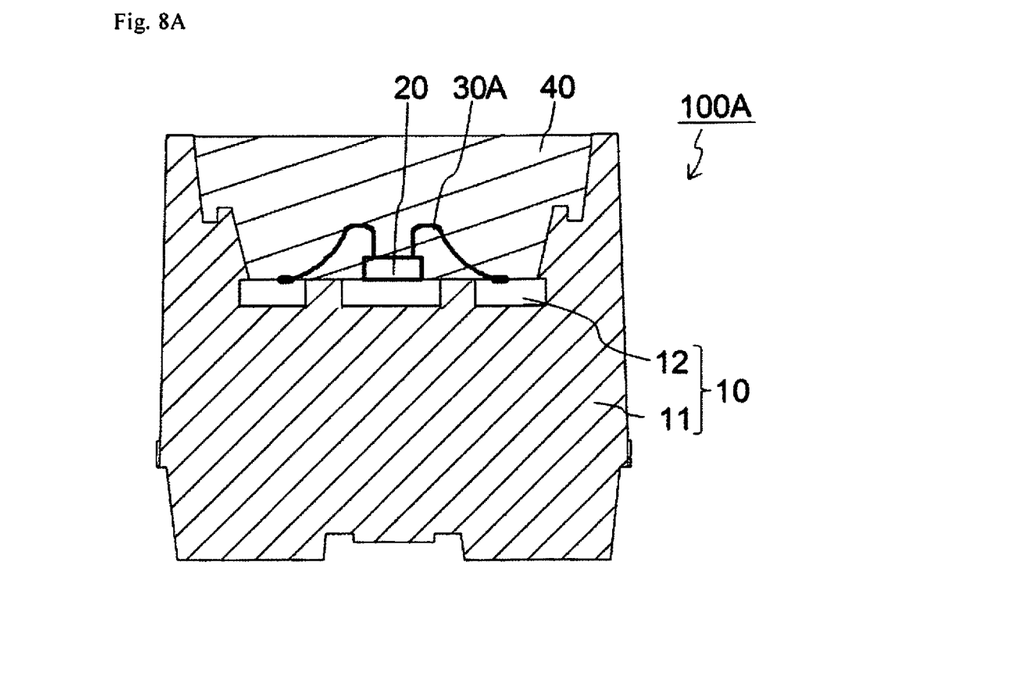
FIG. 8A is a schematic cross-sectional view of an illustrative light-emitting device obtained by a method for manufacturing a light-emitting device according to an embodiment.
Figure 8B:
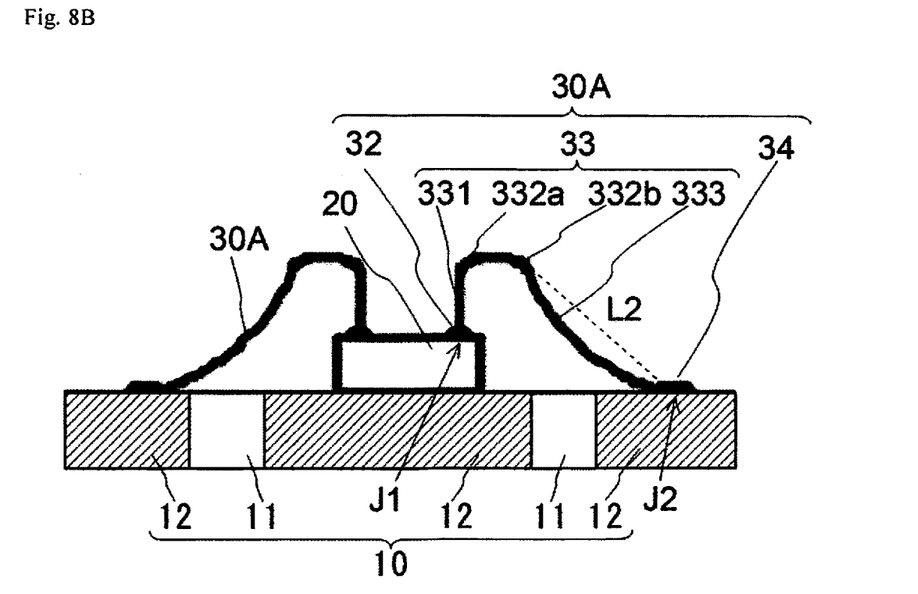
FIG. 8B is a schematic partial enlarged view of FIG. 8A.

FIG. 8A is a schematic cross-sectional view of a light-emitting device 100A that includes wires 30A each having a loop shape (trapezoidal loop) with two bent portions. FIG. 8B is a schematic partial enlarged view of part of FIG. 8A including the wires 30A. The only difference from the light-emitting device 100 shown in FIG. 1B and other drawings is the shape of the loop portions of the wires, and the other part of the structure is substantially the same. Hence, the following mainly describes the loop portions of the wires, and other descriptions are omitted as appropriate.

Each of the wires 30A includes the ball portion 32 and the connecting portion 34 respectively connected to the first connecting point J1 and the second connecting point J2. A loop portion 33 between the ball portion 32 and the connecting portion 34 includes the neck portion 331 above the ball portion 32, a first bent portion 332a that is located at the highest position in the loop portion 33, and a second bent portion 332b. The loop portion 33 further includes the flexure portion 333 between the second bent portion 332b and the connecting portion 34. The flexure portion 333 has a length longer than that of a shortest imaginary line L2 that is a straight line connecting the second bent portion 332b and the connecting portion 34. Also, the flexure portion 333 has a shape including a flexure such that the flexure portion 333 is located below the shortest imaginary line L2.

Since the wire 30A has such a loop shape including the flexure portion 333, breaking of the wire 30A due to expansion and contraction of the encapsulating member 40 is prevented. In addition, the two bent portions make it difficult for the wire 30A to have contact with the light-emitting element 20.

The above-mentioned loop shape can be formed by the following connecting of a wire. The connecting of a wire includes the first connecting step, the first transferring step, the second transferring step, a second-a transferring step, a second-b transferring step, the third transferring step, and the second connecting step. In other words, the connecting of a wire includes additional steps between the second transferring step and the third transferring step. These additional steps enable formation of, for example, a loop shape (trapezoidal loop) that includes a plurality of bent portions. Also in this case, the third transferring step of transferring the capillary to the third point located on the +X side beyond the second connecting point forms the loop shape including the flexure portion.

Figure 9A:
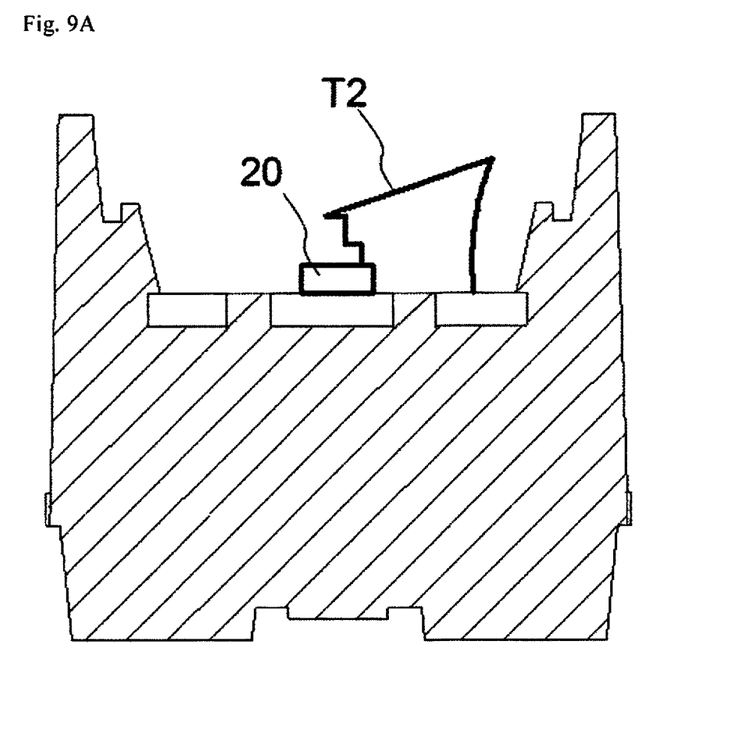
FIG. 9A is a schematic cross-sectional view showing a movement track of the capillary in the method for manufacturing a light-emitting device according to the embodiment.
Figure 9B:
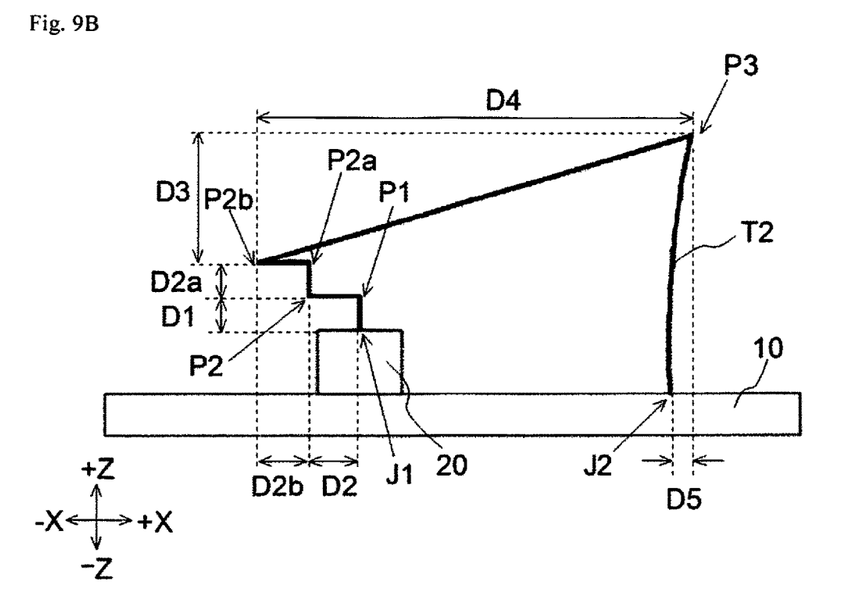
FIG. 9B is a schematic partial enlarged view of FIG. 9A.
Figure 10:
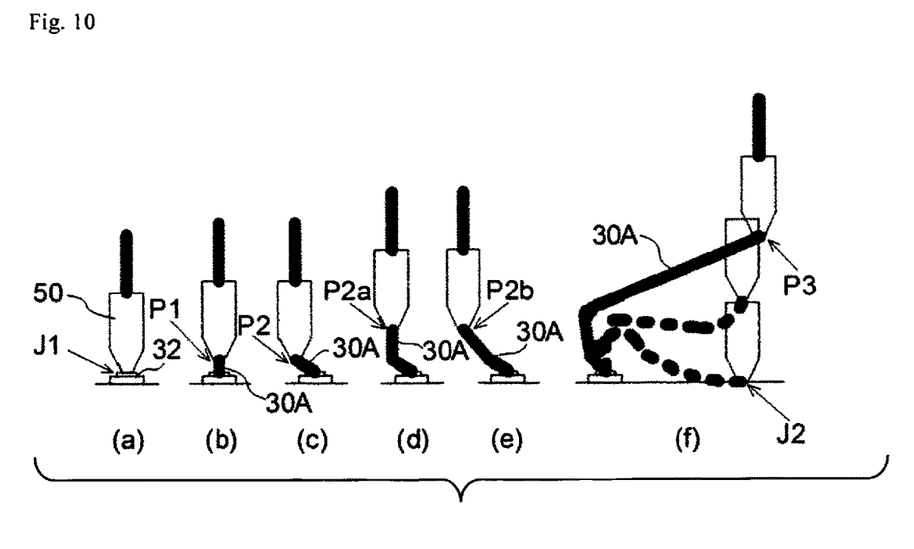
FIG. 10 includes diagrams (a) to (f) schematically showing wire shapes at respective points along the movement track shown in FIG. 9B.

FIG. 9A and FIG. 9B are diagrams schematically showing a movement track T2 of the capillary. FIG. 9B is a schematic partial enlarged view of FIG. 9A. FIG. 10(a) to FIG. 10(f) are diagrams schematically showing shapes of the wire 30A at respective points along the movement track T2 shown in FIG. 9B.

Since the descriptions of the first connecting step, the first transferring step, and the second connecting step overlap the descriptions referring to FIG. 4A and FIG. 4B, and FIG. 5(a) to FIG. 5(d), unessential part of the descriptions is omitted.

(Second-a Transferring Step)

The second-a transferring step is performed after the second transferring step. In the second-a transferring step, the capillary 50 is transferred from the second point P2 to a second-a point P2a. The second-a point P2a is located in the +Z direction when viewed from the second point P2, as shown in FIG. 9B. The position of the second-a point P2a determines the distance between the first bent portion 332a and the second bent portion 332b.

A distance D2a between the second point P2 and the second-a point P2a, that is, the distance D2a in the second-a transferring step, can be freely set. Preferably, the distance is set within a range in which contact with the light-emitting element is prevented. The capillary 50 is transferred upward in this step.

(Second-b Transferring Step)

In the second-b transferring step, the capillary 50 is transferred from the second-a point P2a to a second-b point P2b. The second bent portion 332b of the wire 30A is formed in the second-b transferring step. The second-b point P2b is located in the −X direction when viewed from the second-a point P2a, as shown in FIG. 9B. The operation of the capillary in the second-b transferring step is what is called a reverse operation. When the capillary 50 is transferred to the second-b point P2b in the second-b transferring step, the wire 30A is pulled in a slant direction, as shown in FIG. 10(e).

The second-b point P2b is a position that defines the second bent portion 332b in the loop shape of the wire 30A. The position of the second-b point P2b determines the shape of the second bent portion 332b.

A distance D2b between the second-a point P2a and the second-b point P2b, that is, the distance D2b in the second-b transferring step, can be freely set.

Examples of the wire having the above-mentioned loop shape include electrically-conductive wires made of metals such as gold, copper, platinum, and aluminum and alloys containing at least these metals. In particular, gold, which has a good thermal resistance and the like, is preferable. The diameter of the wire is preferably 18 μm to 30 μm. The coefficient of linear expansion of the wire is preferably in a range of $14.2 \times 10^{-6}$ to $19.7 \times 10^{-6}$, more preferably in a range of $17.6 \times 10^{-6}$ to $18.9 \times 10{-6}$.

Forming Encapsulating Member

Figure 7:
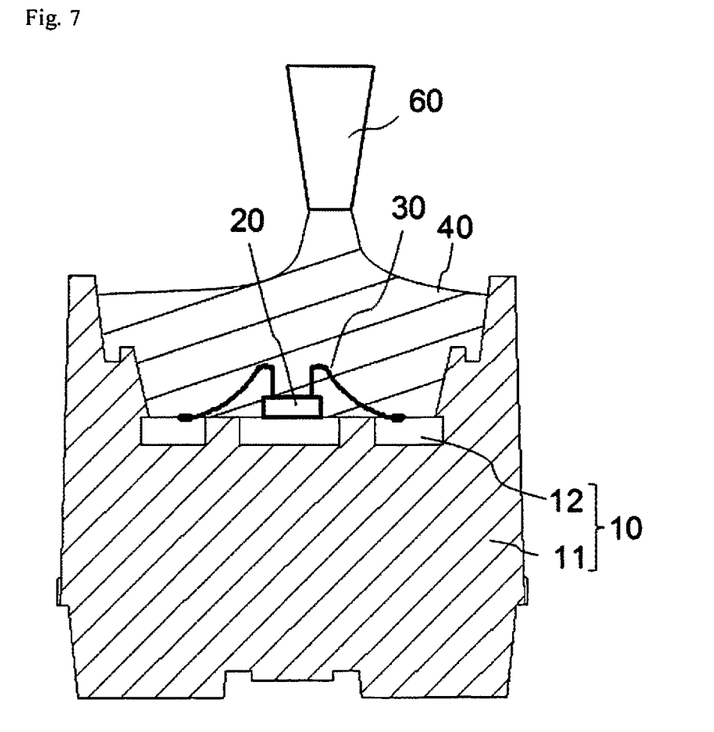
FIG. 7 is a schematic cross-sectional view for illustrating the method for manufacturing a light-emitting device according to the embodiment.

Subsequently, the encapsulating member 40 that encapsulates the light-emitting elements 20 and the wires 30 is formed as shown in FIG. 7. Since an example in which the substrate 10 has the depressed portion 13 is illustrated here, the encapsulating member 40 is formed in the depressed portion 13. The encapsulating member 40 can be formed by supplying a liquid or paste-like resin material through a dispenser nozzle or the like and then curing the resin material with heat or light.

As the material for the encapsulating member, a material that can transmit light from the light-emitting elements and has light resistance is preferable. A material that has a coefficient of linear expansion in a range of $3 \times 10^{-6}$ to $350 \times 10^{-6}$ is preferable. Specific examples of the material include insulating resin compositions that can transmit light from the light-emitting elements, such as silicone resin compositions, modified silicone resin compositions, epoxy resin compositions, modified epoxy resin compositions, and acrylic resin compositions. Silicone resins, epoxy resins, urea resins, fluorocarbon resins, and hybrid resins each containing at least one of these resins can also be used. These organic substances are not limiting, and inorganic substances, such as glass and colloidal silica, can also be used. In addition to such materials, colorants, light-diffusing agents, light-reflecting materials, various fillers, wavelength conversion members (phosphors), or the like can be contained as requested.

Examples of the phosphors include oxide-based, sulfide-based, and nitride-based phosphors. For example, in the case where gallium nitride light-emitting elements that emit blue light are used as the light-emitting elements, at least one, or two or more phosphors that absorb blue light can be used. Examples of such phosphors include YAG and LAG phosphors that emit yellow to green light, SiAlON (β-SiAlON) phosphors that emit green light, SCASN and CASN phosphors, KSF phosphors (K2SiF6:Mn), sulfide phosphors, and nanophosphors that emit red light. The encapsulating member preferably contains 5% by mass to 120% by mass of these phosphors.

The light-emitting device 100 including the wires 30 that have the loop shape including the flexures as shown in FIG. 1B can be obtained as described above.

The light-emitting devices in the present disclosure are suitably used in various applications that employ light-emitting devices including wires.

The invention claimed is:

1. A method for manufacturing a light-emitting device comprising:
    providing a substrate on which a light-emitting element is mounted;
    a first connecting step of forming an initial ball on a wire inserted into a capillary, bringing the initial ball into contact with a first connecting point on the light-emitting element to form a ball portion of the wire joined to the first connecting point;
    a first transferring step of transferring the capillary to a first point located in a +Z direction above the first connecting point;
    a second transferring step of transferring the capillary from the first point to a second point located in a −X direction from the first point, the −X direction being opposite from a second connecting point on the substrate;
    a third transferring step of transferring the capillary from the second point to a third point located in a +X direction beyond the second connecting point on the substrate and located in the +Z direction above the second connecting point;
    a second connecting step of transferring the capillary to the second connecting point located in the −X direction from the third point and joining the wire to the second connecting point so that the first connecting point on the light emitting element and the second connecting point on the substrate are connected via the wire with the second connecting point being located in the +X direction from the first connecting point; and
    forming an encapsulating member to encapsulate the wire.

2. The method for manufacturing a light-emitting device according to claim 1, wherein
    a distance between the third point and the second connecting point in a top view is 30 μm to 150 μm.

3. The method for manufacturing a light-emitting device according to claim 1, wherein
    the third transferring step includes
        transferring the capillary from the second point to a second-a point located in the +Z direction above the second point
        transferring the capillary from the second-a point to a second-b point located in the −X direction from the second-a point; and
        transferring the capillary from the second-b point to the third point.

* * * * *